United States Patent
Lin et al.

(10) Patent No.: US 11,562,941 B2
(45) Date of Patent: *Jan. 24, 2023

(54) SEMICONDUCTOR PACKAGES HAVING THERMAL CONDUCTIVE PATTERNS SURROUNDING THE SEMICONDUCTOR DIE

(71) Applicant: Taiwan Semiconductor Manufacturing Company, Ltd., Hsinchu (TW)

(72) Inventors: Jing-Cheng Lin, Hsinchu (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 37 days.

This patent is subject to a terminal disclaimer.

(21) Appl. No.: 17/168,186

(22) Filed: Feb. 5, 2021

(65) Prior Publication Data
US 2021/0159147 A1 May 27, 2021

Related U.S. Application Data

(63) Continuation of application No. 16/431,747, filed on Jun. 5, 2019, now Pat. No. 10,916,488.

(60) Provisional application No. 62/691,627, filed on Jun. 29, 2018.

(51) Int. Cl.
*H01L 23/40* (2006.01)
*H01L 23/433* (2006.01)
(Continued)

(52) U.S. Cl.
CPC ........ *H01L 23/4334* (2013.01); *H01L 21/561* (2013.01); *H01L 21/568* (2013.01);
(Continued)

(58) Field of Classification Search
CPC ......... H01L 23/34; H01L 23/36; H01L 23/40; H01L 2023/4037; H01L 2023/4043; H01L 2023/4062; H01L 2023/4068
(Continued)

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |

(Continued)

FOREIGN PATENT DOCUMENTS

| | | |
|---|---|---|
| KR | 20130035805 | 4/2013 |
| KR | 20150112861 | 10/2015 |

(Continued)

OTHER PUBLICATIONS

"Notice of Allowance of Korea Counterpart Application", dated Jul. 28, 2021, with English translation thereof, p. 1-p. 6.

*Primary Examiner* — Hoai V Pham
(74) *Attorney, Agent, or Firm* — JCIPRNET

(57) ABSTRACT

A semiconductor package includes a semiconductor die, a first thermal conductive pattern and a second thermal conductive pattern. The semiconductor die is encapsulated by an encapsulant. The first thermal conductive pattern is disposed aside the semiconductor die in the encapsulant. The second thermal conductive pattern is disposed over the semiconductor die, wherein the first thermal conductive pattern is thermally coupled to the semiconductor die through the second thermal conductive pattern and electrically insulated from the semiconductor die.

20 Claims, 11 Drawing Sheets

(51) Int. Cl.
*H01L 21/56* (2006.01)
*H01L 23/00* (2006.01)
*H01L 23/367* (2006.01)
*H01L 25/10* (2006.01)
*H01L 25/18* (2006.01)
*H01L 23/31* (2006.01)

(52) U.S. Cl.
CPC ...... *H01L 23/3121* (2013.01); *H01L 23/3135* (2013.01); *H01L 23/3675* (2013.01); *H01L 24/24* (2013.01); *H01L 24/25* (2013.01); *H01L 25/105* (2013.01); *H01L 25/18* (2013.01); *H01L 2224/24175* (2013.01); *H01L 2224/25171* (2013.01); *H01L 2224/82005* (2013.01); *H01L 2225/1035* (2013.01); *H01L 2225/1041* (2013.01); *H01L 2225/1058* (2013.01)

(58) Field of Classification Search
USPC .................................................. 257/176, 796
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 9,978,661 | B2* | 5/2018 | Im .................... H01L 21/563 |
| 10,916,488 | B2* | 2/2021 | Lin .................... H01L 23/4334 |
| 2011/0018114 | A1* | 1/2011 | Pagaila .............. H01L 23/36 257/E23.101 |
| 2013/0154078 | A1 | 6/2013 | Choi et al. |
| 2017/0358556 | A1 | 12/2017 | Bitz et al. |

FOREIGN PATENT DOCUMENTS

| | | |
|---|---|---|
| KR | 20180005179 | 1/2018 |
| KR | 20180020849 | 2/2018 |

* cited by examiner

SEMICONDUCTOR PACKAGES HAVING THERMAL CONDUCTIVE PATTERNS SURROUNDING THE SEMICONDUCTOR DIE

CROSS-REFERENCE TO RELATED APPLICATION

This application is a continuation application of U.S. application Ser. No. 16/431,747, filed on Jun. 5, 2019 and now allowed. The prior application Ser. No. 16/431,747 claims the priority benefit of U.S. provisional application Ser. No. 62/691,627, filed on Jun. 29, 2018. The entirety of the above-mentioned patent applications is hereby incorporated by reference herein and made a part of this specification.

BACKGROUND

In the packaging of integrated circuits, semiconductor dies may be packaged by a molding compound, and may be bonded to other package components such as interposers and package substrates. Heat dissipation is a challenge in the semiconductor packages. There exists a bottleneck in efficiently dissipating the heat generated in the inner dies of the semiconductor packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
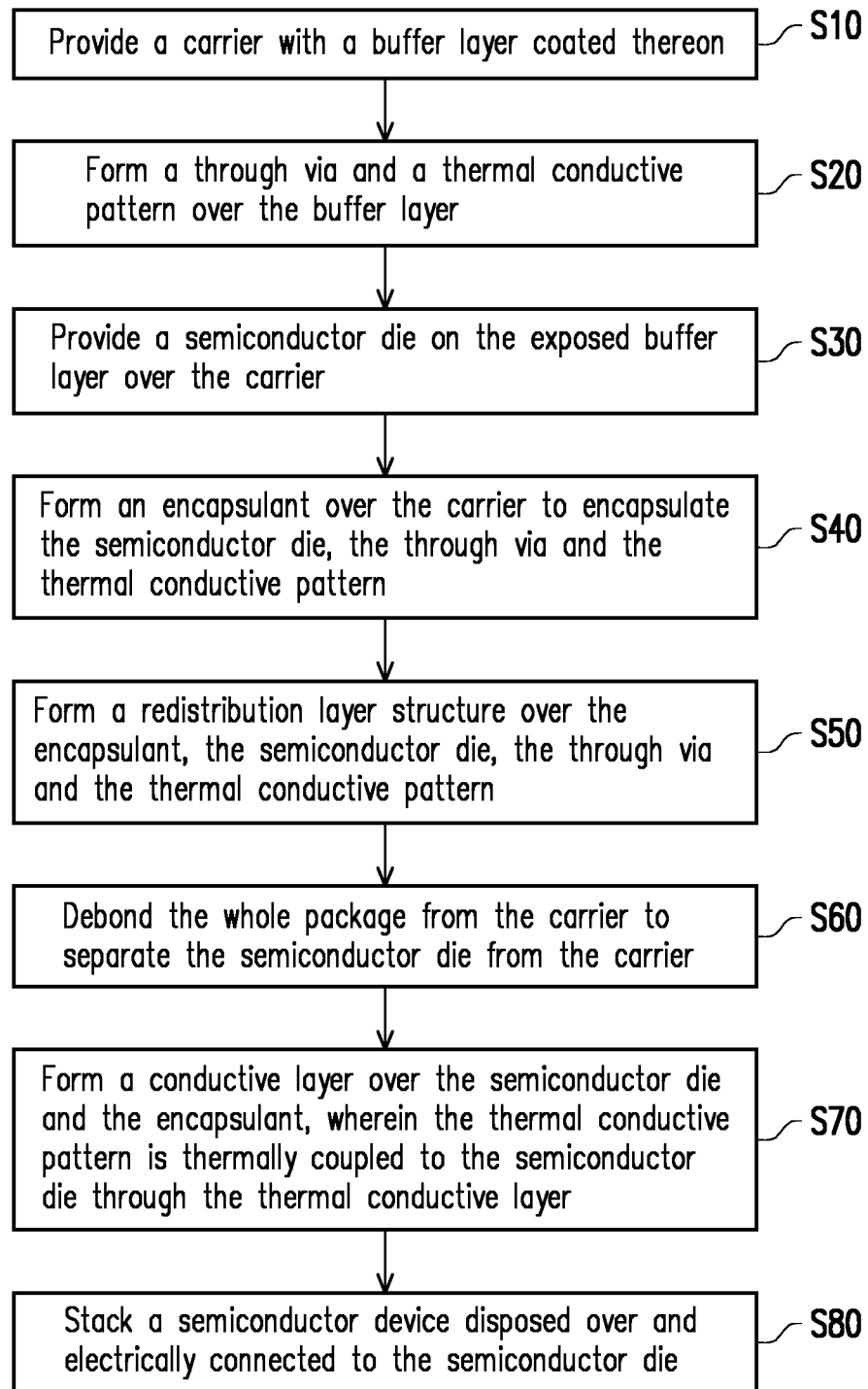
FIG. 1 is an exemplary flow chart showing the process steps of a method of forming a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution circuit structure or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is an exemplary flow chart showing the process steps of a method of forming a semiconductor package in accordance with some embodiments. FIG. 2A to FIG. 2I are cross-sectional views of a method of forming a semiconductor package in accordance with some embodiments. FIG. 3 is a simplified top view of FIG. 2I. For simplicity and clarity of illustration, only few elements such as a semiconductor die, through vias, a thermal conductive pattern and a thermal conductive layer are shown in the simplified top view of FIG. 3.

Figure 2A:
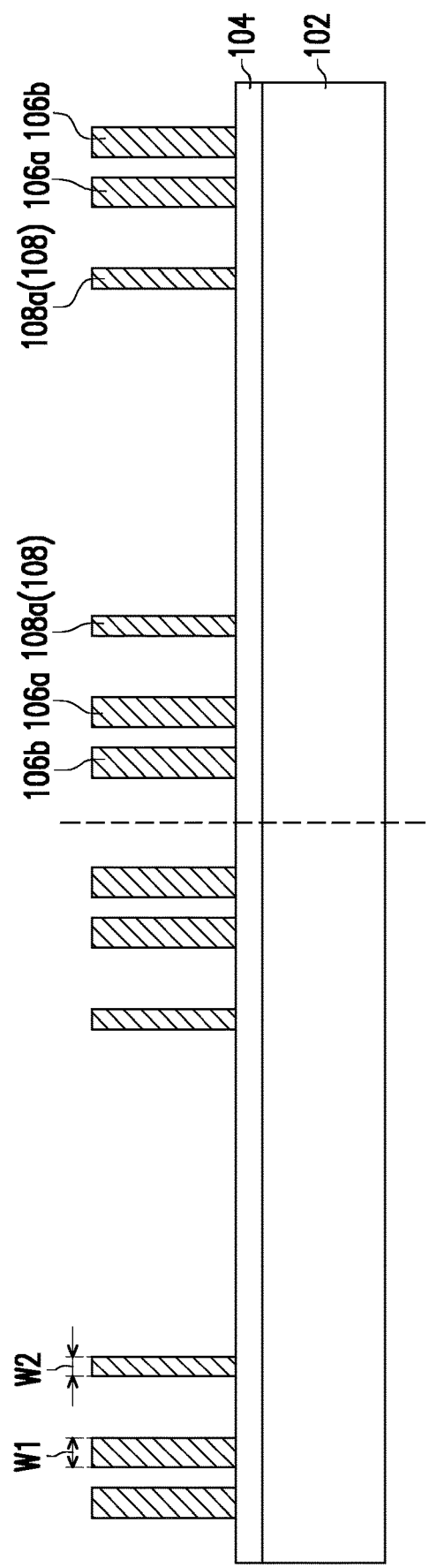
FIG. 2A to FIG. 2I are cross-sectional views of a method of forming a semiconductor package in accordance with some embodiments.
Figure 3:
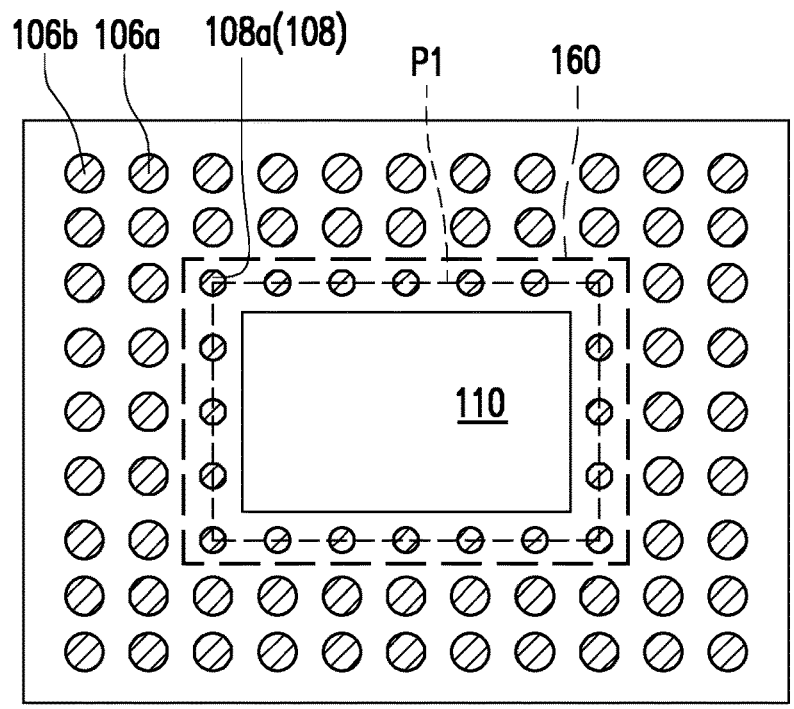
FIG. 3 is a simplified top view of FIG. 2I.

Referring to FIG. 1 and FIG. 2A, in Step S10, a carrier 102 with a buffer layer 104 coated thereon is provided. In some embodiments, the carrier 102 may be a glass carrier or any suitable carrier for carrying a semiconductor wafer or a reconstituted wafer for the manufacturing method of the semiconductor package. In some embodiments, the buffer layer 104 includes a debond layer, and the material of the debond layer may be any material suitable for bonding and debonding the carrier 102 from the above layers or wafer disposed thereon. In some embodiments, the buffer layer 104 includes, for example, a light-to-heat conversion ("LTHC") layer, and such layer enables debonding from the carrier by applying laser irradiation. In some embodiments, the buffer layer 104 may further include a dielectric layer between the debond layer and the carrier 102, and the dielectric layer is made of a dielectric material including benzocyclobutene ("BCB"), polybenzooxazole ("PBO") or any other suitable polymer-based dielectric material.

In Step S20, a through via 106a, 106b and a thermal conductive pattern 108 are formed over the buffer layer 104. In some embodiments, a plurality of through vias 106a, 106b are formed on the buffer layer 104 to surround an area for a semiconductor die, for example. In some embodiments, as shown in FIG. 3, the through vias 106a, 106b may be arranged along at least one ring-shaped path surrounding the area for the semiconductor die. In some embodiments, a first group of the through vias 106a is arranged along a first ring-shaped path, and a second group of the through vias 106b is arranged along a second ring-shaped path surrounding the first ring-shaped path, for example. In other words, the through vias 106a is disposed between the through via 106b and the area for the semiconductor die. In some embodiments, the through vias 106a, 106b of the same group may be arranged regularly, that is, a distance between the adjacent through vias 106a, 106b of the same group is constant. In some alternative embodiments, the through vias 106a, 106b of the same group may be arranged irregularly or randomly, that is, a distance between the through vias 106a, 106b of the same group is not constant. In some alternative embodiments, the through vias may be arranged along one ring-shaped path or more than two ring-shaped paths. In some alternative embodiments, when the through vias are arranged along more than two ring-shaped paths, the distance between adjacent groups of the through vias may be constant.

In some embodiments, the material of the through via 106a, 106b includes copper (Cu), aluminum (Al), aluminum copper alloy (AlCu), gold, titanium, cobalt, an alloy, or any suitable conductive material. The through via 106a, 106b may be formed by, for example, electrochemical plating (ECP), electroplating, electroless plating or any other suitable process.

In some embodiments, the thermal conductive pattern 108 is disposed on the buffer layer 104 between the through vias 106a, 106b and the area for the semiconductor die. In some embodiments, the thermal conductive pattern 108 includes a plurality of discrete through vias 108a, for example. In some embodiments, the through vias 108a are arranged along one ring-shaped path P1 surrounding the area for the semiconductor die, for example. In some embodiments, the through vias 108a may be arranged regularly, that is, a distance between the adjacent through vias 108a is constant. In some alternative embodiments, the through vias 108a may be arranged irregularly or randomly, that is, a distance between the through vias 108a is not constant. In some alternative embodiments, the ring-shaped path P1 is rectangular, for example. However, the ring-shaped path P1 may be designed as other suitable ring shape such as circle, square or polygon depending on the shape of the semiconductor die and/or requirements.

Herein, the through via 106a, 106b indicates functional through via, and the through via 108a indicate non-functional through via. Specifically, the through via 106a, 106b in a package structure is electrically connected to a front-side or back-side redistribution circuit structure or an electrical component of the same package structure or another package structure. However, the through via 108a may be at a floating potential and electrically insulated from a front-side or back-side redistribution circuit structure or an electrical component of the same package structure or another package structure.

In some embodiments, as shown in FIG. 3, the through via 108a may be partially aligned with the through via 106a, 106b in at least one of a first direction and a second direction which are perpendicular to a stacking direction along which the die and the semiconductor device are stacked. In some embodiments, the first direction and the second direction are horizontal directions such as x-direction and y-direction, and the stacking direction is a vertical direction such as z-direction, for example. In some alternative embodiments, the through via 108a may be not aligned with the through via 106a, 106b in the first direction and/or second direction. In some embodiments, a distance between the through via 108a and the area for the semiconductor die may be smaller than a distance between the adjacent through vias 106a, 108a. However, in some alternative embodiments, the distance between the through via 108a and the area for the semiconductor die may be larger than or substantially equal to the distance between the adjacent through vias 106a, 108a. In some embodiments, the distance between the adjacent through vias 106a, 108a may be larger than the distance between the adjacent through vias 106a, 106b. In some embodiments, the distance between the adjacent through vias 106a, 108a may be two or more times longer than the distance between the adjacent through vias 106a, 106b. For example, the distance between the adjacent through vias 106a, 108a may be three, four, five or six times longer than the distance between the adjacent through vias 106a, 106b. However, in some alternative embodiments, the distance between the adjacent through vias 106a, 108a may be smaller than or substantially equal to the distance between the adjacent through vias 106a, 106b.

In some embodiments, a top surface of the thermal conductive pattern 108 may be substantially flush and coplanar with top surfaces of the through vias 106a, 106b. In some embodiments, the top surfaces of the through vias 108a may be substantially flush and coplanar with the top surfaces of the through vias 106a, 106b, for example. However, in some alternative embodiments, the top surface of the thermal conductive pattern 108 may be lower than or higher than the top surfaces of the through vias 106a, 106b.

In some embodiments, the material of the thermal conductive pattern 108 includes copper (Cu), aluminum (Al), aluminum copper alloy (AlCu), gold, titanium, cobalt, an alloy, or any other suitable conductive material. The thermal conductive pattern 108 may be formed by, for example, electrochemical plating (ECP), electroplating, electroless plating or any other suitable process. In some embodiments, the material of the thermal conductive pattern 108 may be the same as the material of the through vias 106a, 106b, for example. In some alternative embodiments, the material of the thermal conductive pattern 108 may be different from the material of the through vias 106a, 106b. In some embodiments, the thermal conductive pattern 108 and the through vias 106a, 106b may be formed simultaneously. For example, the through vias 108a and the through vias 106a, 106b may be formed simultaneously. In some embodiments, for plating uniformity, a dimension (e.g., width W2) of the through via 108a ranges from one half to two times of a dimension (e.g., width W1) of one of the through via 106a, 106b. In some embodiments, the width W2 is less than the width W1, for example. In some alternative embodiments, the through vias 106a, 106b and the thermal conductive pattern 108 may be formed separately.

Figure 2B:
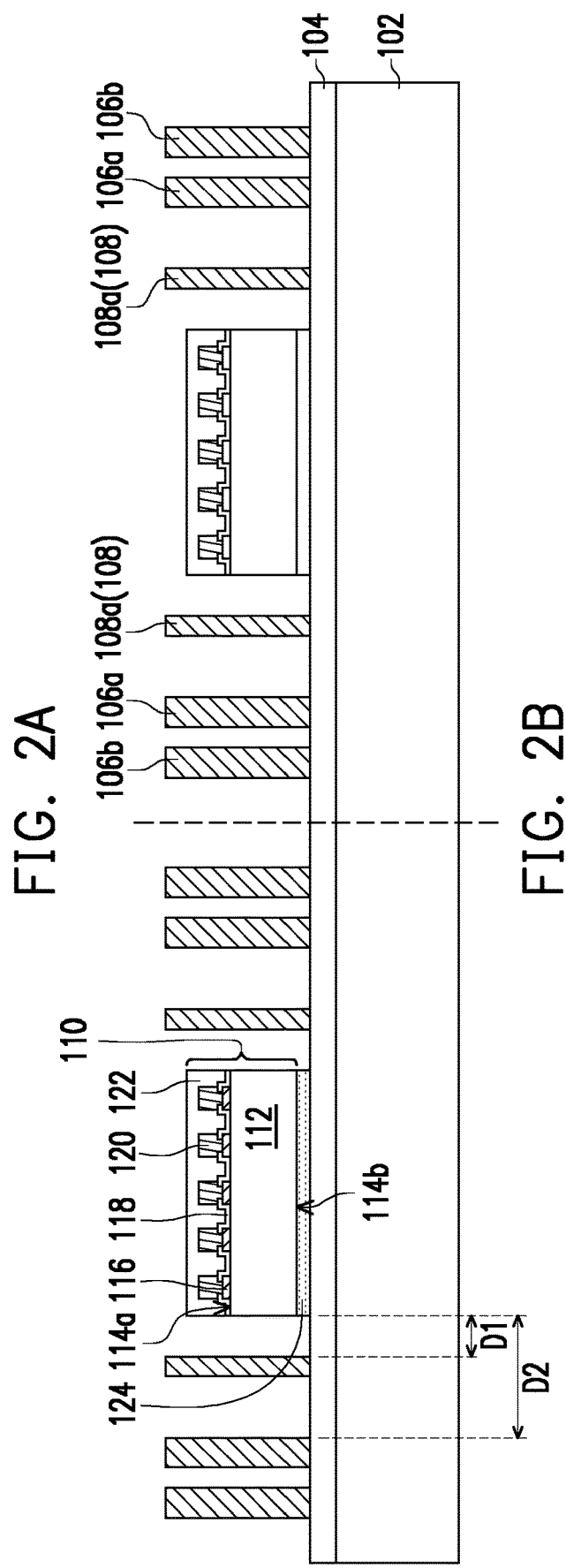

Referring to FIG. 1 and FIG. 2B, in Step S30, a semiconductor die 110 is provided and disposed on the exposed buffer layer 104 over the carrier 102. In some embodiments, the semiconductor die 110 may be a digital chip, an analog chip or a mixed signal chip, such as an application-specific integrated circuit ("ASIC") chip, a sensor chip, a wireless and radio frequency chip, a memory chip, a logic chip, a voltage regulator chip or any other suitable chip. In some embodiments, the semiconductor die 110 is a system on chip (SoC), for example. In some embodiments, the semiconductor die 110 includes a substrate 112, an active surface 114a, a rear surface 114b opposite to the active surface 114a, a plurality of pads 116 distributed on the active surface 114a, a passivation layer 118 covering the active surface 114a, a plurality of metal posts 120 and a protection layer 122. The substrate 112 may be a semiconductor substrate, such as a silicon substrate, although it may be formed of other semiconductor materials including, and not limited to, silicon germanium, silicon carbon, gallium arsenide, or the like. The semiconductor die 110 may include a device layer formed in or on the substrate 112. In some embodiments, the device layer may include transistors, resistors, capacitors, inductors, and/or the like. The pads 116 may be formed on and electrically connected to the device layer and may be pads of an interconnect structure. The pads 116 are partially exposed by the passivation layer 118, and the metal posts 120 are disposed on and electrically connected to the pads 116. The pads 116 are aluminum contact pads, for example. The metal posts 120 are copper posts or copper alloy posts, for example. The protection layer 122 covers the metal posts 120 and the passivation layer 118. In some alternative embodiments, before placing the semiconductor die 110 on the carrier 102, the metal posts 120 are uncovered (i.e., bare dies not molded or encapsulated). In some embodiments, the protection layer 122 is a polymer layer. For example, the protection layer 122 includes a photo-sensitive material such as PBO, polyimide, BCB, a combination thereof, or the like.

In some embodiments, a top surface of the semiconductor die 110 is not coplanar with the top surfaces of the through vias 106a, 106b and the thermal conductive pattern 108. In some embodiments, the top surface of the semiconductor die 110 is lower than the top surfaces of the through vias 106a, 106b and the thermal conductive pattern 108, for example. In some alternative embodiments, the top surface of the semiconductor die 110 may be substantially flush with or higher than the top surfaces of the through vias 106a, 106b and the thermal conductive pattern 108. In some embodiments, a die attach film 124 is disposed between the rear surface 114b of the semiconductor die 110 and the buffer layer 104 for better attachment, and the rear surface 114b of the semiconductor die 110 is adhered to the carrier 102. In some embodiments, the semiconductor die 110 is placed over the carrier 102 in the area aside the thermal conductive pattern 108. In some embodiments, the semiconductor die 110 is disposed within the area surrounded by the thermal conductive pattern 108.

In some embodiments, the thermal conductive pattern 108 surround the semiconductor die 110, and the through vias 106a, 106b surround the thermal conductive pattern 108. In other words, the thermal conductive pattern 108 is disposed between the semiconductor die 110 and the through vias 106a, 106b. Accordingly, a first minimum distance D1 between the through via 108a and the semiconductor die 110 is less than a second minimum distance D2 between through via 106a and the semiconductor die 110. In some embodiments, the through vias 106a, 106b and thermal conductive pattern 108 are respectively distributed at four sides of the semiconductor die 110, for example. In some embodiments, the through vias 106a, 106b and the through vias 108a are respectively distributed at four sides of the semiconductor die 110, for example. In some embodiments, the distribution of the through vias 106a, 106b and the through via 108a at one side of the semiconductor die 110 is substantially symmetrical to the distribution of the through vias 106a, 106b and the through via 108a at the other side of the semiconductor die 110. Specifically, the through vias 106a, 106b and the through via 108a at one side are symmetrical to those at the other side in configuration and position with respect to the central semiconductor die 110. In some embodiments, as shown in FIG. 2B, the dotted line represents the cutting line of the whole package in the subsequent cutting process and the through vias 106b are arranged close to but not on the cutting line, and are arranged around the thermal conductive pattern 108 and the semiconductor die 110.

Figure 2C:
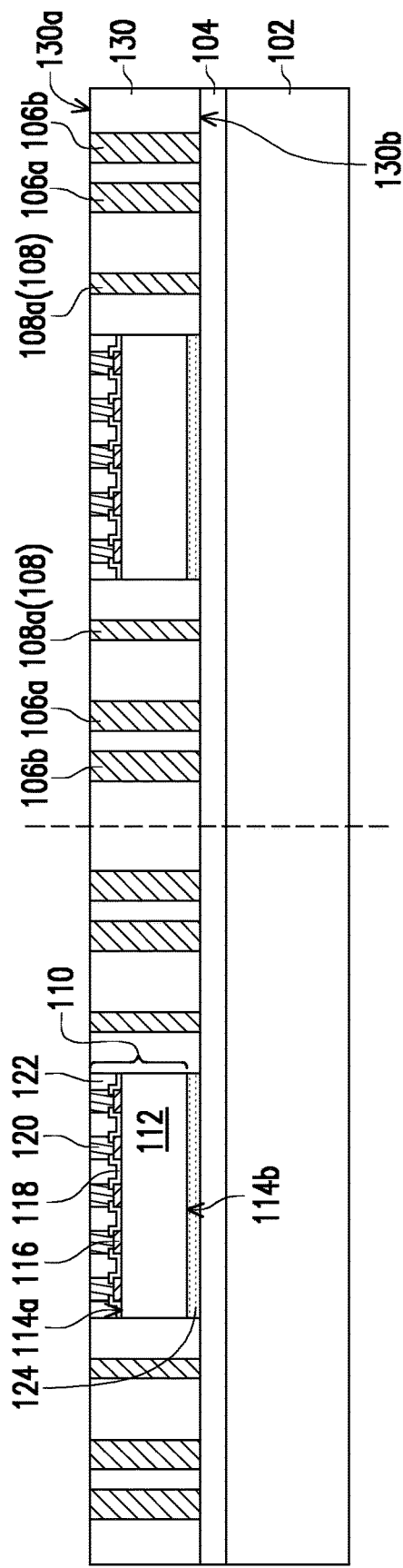

Referring to FIG. 1 and FIG. 2C, in Step S40, an encapsulant 130 is formed over the carrier 102 to encapsulate the semiconductor die 110, the through via 106a, 106b and the thermal conductive pattern 108. In some embodiments, the encapsulant 130 covers the buffer layer 104 and fills among the semiconductor die 110, the thermal conductive pattern 108 and the through vias 106a, 106b. In some embodiments, the encapsulant 130 is disposed among the semiconductor die 110, the through vias 108a and the through vias 106a, 106b. In some embodiments, the encapsulant 130 laterally encapsulates the semiconductor die 110, that is, sidewalls of the semiconductor die 110 is encapsulated by the encapsulant 130. In some embodiments, the encapsulant 130 is formed by forming a molding material covering the top surfaces of the semiconductor die 110, the through vias 106a, 106b and the thermal conductive pattern 108 by an over-molding process, and then removing portions of the molding material by a planarization process to expose the top surfaces of the semiconductor die 110, the through vias 106a, 106b and the thermal conductive pattern 108. In some embodiments, the planarization process for planarizing the molding material and the semiconductor die 110, the through vias 106a, 106b and the thermal conductive pattern 108 includes a fly cut process, a grinding process, a chemical mechanical polishing ("CMP") process or any other suitable process. In some embodiments, portions of the protection layer 122 of the semiconductor die 110, the through vias 106a, 106b and the thermal conductive pattern 108 are also removed by the planarization process. In some embodiments, a first surface 130a of the encapsulant 130 is substantially coplanar and flush with the top surfaces of the protection layer 122 and the metal posts 120 of the semiconductor die 110, the through vias 106a, 106b and the thermal conductive pattern 108. In some embodiments, the through vias 106a, 106b and the thermal conductive pattern 108 penetrate and are embedded the encapsulant 130, respectively. In some embodiments, the encapsulant 130 includes a molding compound, a molding underfill, a resin such as epoxy, a photo-sensitive material such as PBO, polyimide, BCB, a combination thereof, or the like.

Figure 2D:
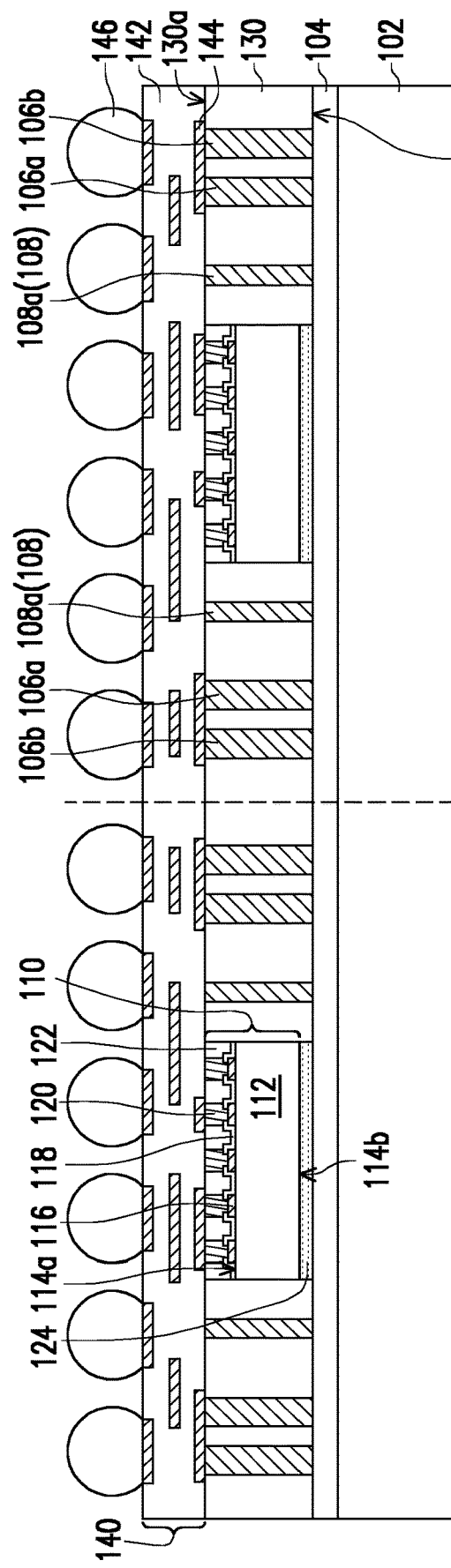

Referring to FIG. 1 and FIG. 2D, in Step S50, in some embodiments, a redistribution circuit structure 140 is formed over the encapsulant 130, the semiconductor die 110, the through via 106a, 106b and the thermal conductive pattern 108. In some embodiments, the redistribution circuit structure 140 is formed over the first surface 130a of the encapsulant 130, the active surface 114a of the semiconductor die 110 and the top surfaces of the through vias 106a, 106b and the thermal conductive pattern 108. In some embodiments, the redistribution circuit structure 140 is disposed on the top surfaces of the metal posts 120 of the semiconductor die 110. In some embodiments, the redistribution circuit structure 140 is electrically connected to the through vias 106a, 106b and the semiconductor die 110 and electrically insulated from the thermal conductive pattern 108.

In some embodiments, the redistribution circuit structure 140 includes a dielectric layer 142 and a plurality of redistribution patterns 144 in the dielectric layer 142. In some embodiments, the redistribution patterns 144 are electrically connected to the through vias 106a, 106b or an electrical component of the same package structure such as the metal posts 120 of the semiconductor die 110. In some embodiments, the redistribution patterns 144 is electrically insulated from the thermal conductive pattern 108. In some embodiments, the bottom redistribution pattern 144 of the redistribution circuit structure 140 is in contact with the through vias 106a, 106b and the metal posts 120 of the semiconductor die 110, for example. In some embodiments, the thermal conductive pattern 108 is electrically insulated from the redistribution patterns 144 through the dielectric layer 142. In some embodiments, the thermal conductive pattern 108 is in contact with the bottom dielectric layer 142, for example. In some embodiments, the material of the redistribution patterns 144 includes aluminum, titanium, copper, nickel, tungsten, silver and/or alloys thereof. In some embodiments, the material of the dielectric layer 142 includes polyimide, benzocyclobutene, or polybenzooxazole. In some embodiments, the dielectric layer 142 may be a single or multiple layer structure. In some embodiments, the redistribution circuit structure 140 is a front-side redistribution circuit structure electrically connected to the semiconductor die 110 and is electrically connected to the through vias 106a, 106b. In some embodiments, as the underlying encapsulant 130 provides better planarization and evenness, the later-formed redistribution circuit structure 140, especially the redistribution pattern 144 with thin line width or tight spacing, can be formed with uniform line-widths or even profiles over the flat and level encapsulant 130, resulting in improved line/wiring reliability.

In some embodiments, a plurality of conductive elements 146 are disposed on and electrically connected to the redistribution circuit structure 140. In some embodiments, prior to disposing the conductive elements 146, flux may be applied so that the conductive elements 146 are better fixed to top redistribution patterns 144 of the redistribution circuit structure 140, and the top redistribution patterns 144 may function as contact pads for the conductive elements 146. In some embodiments, the conductive elements 146 are, for example, solder balls or ball grid array ("BGA") balls placed on the redistribution circuit structure 140 and the top redistribution patterns 144 underlying the conductive elements 146 functions as ball pads. In some embodiments, some of the conductive elements 146 are electrically connected to the semiconductor die 110 through the redistribution circuit structure 140, and some of the conductive elements 146 are electrically connected to the through vias 106a, 106b. In some embodiments, the conductive elements 146 are electrically insulated from the thermal conductive pattern 108.

Figure 2E:
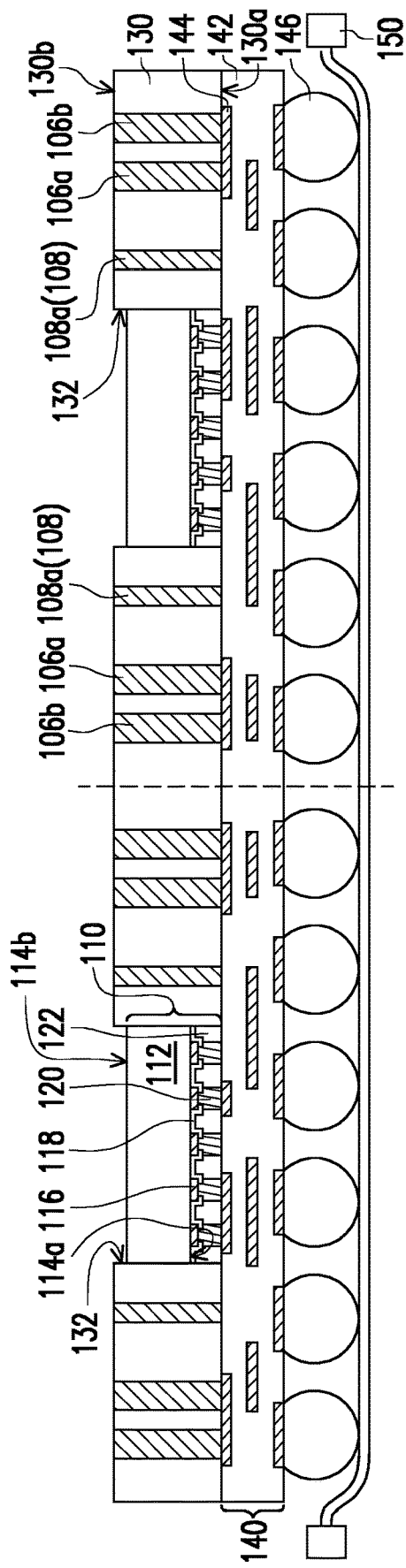

Referring to FIG. 1 and FIGS. 2D and 2E, in Step S60, in some embodiments, the whole package is debonded from the carrier 102 to separate the semiconductor die 110 from the carrier 102. In some embodiments, after debonding from the carrier 102, the buffer layer 104 remained on the whole package is removed through an etching process or a cleaning process. Alternatively, in some alternative embodiments, the buffer layer 104 may be remained.

Then, in some embodiments, the whole package is turned upside down and disposed on a carrier film 150. As the package structure is turned upside down, the top surfaces may become the bottom surfaces and the relative positional relationships (such as above, below, higher or lower) may become the opposite for the package structures as described above, but the same surfaces, common surfaces or interfaces will be marked with the same reference numbers for the semiconductor package. After debonding from the carrier 102, the die attach film 124 is exposed. In some embodiments, the top surface of the die attach film 124 is substantially coplanar and flush with the top surfaces of the encapsulant 130, the through vias 106a, 106b and the thermal conductive pattern 108.

After that, the die attach film 124 is removed, and thus a trench 132 is formed in the encapsulant 130 over the semiconductor die 110. In some embodiments, after removing the die attach film 124, the rear surface 114b of the semiconductor die 110 is exposed. In some embodiments, the rear surface 114b of the semiconductor die 110 is lower than a second surface 130b opposite to the first surface 130a of the encapsulant 130. In addition, the rear surface 114b of the semiconductor die 110 is lower than the top surfaces of the through vias 106a, 106b and the thermal conductive pattern 108.

Figure 2F:
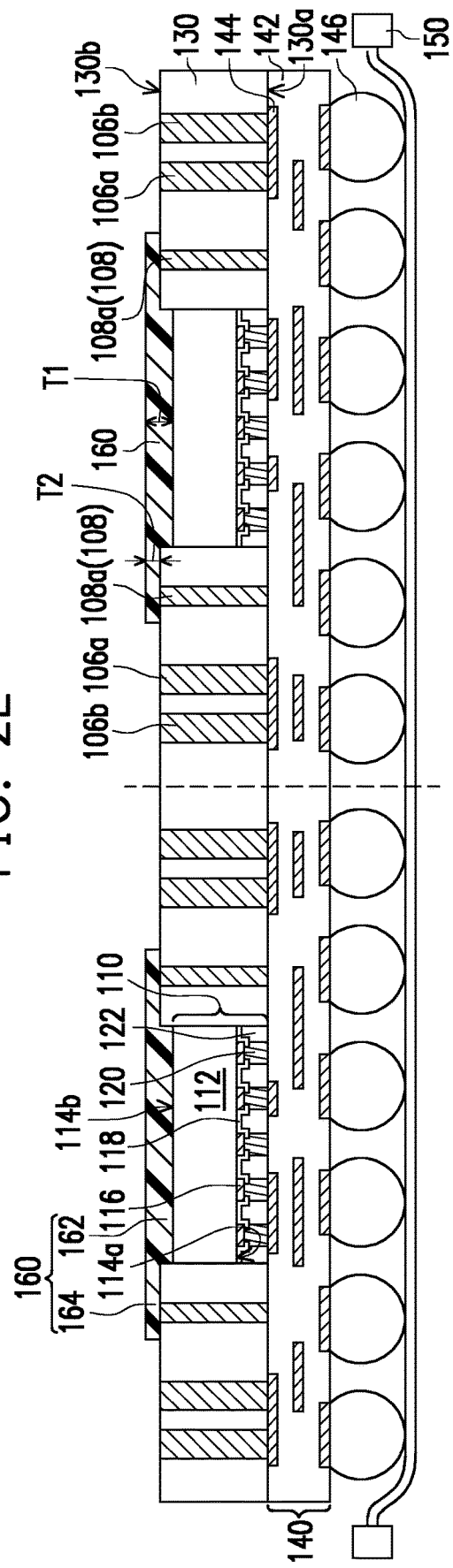

Referring to FIG. 1 and FIGS. 2E and 2F, in Step S70, in some embodiments, a thermal conductive layer 160 is formed over the semiconductor die 110 and the encapsulant 130, wherein the thermal conductive pattern 108 is thermally coupled to the semiconductor die 110 through the thermal conductive layer 160. In some embodiments, a heat dissipation structure includes the thermal conductive pattern 108 and the thermal conductive layer 160. As used herein, being thermally coupled means that causing a change in temperature of a heat dissipation structure will cause in a change in temperature of the semiconductor die and vice-versa. In some embodiments, the thermal conductive layer 160 is formed over the rear surface 114b of the semiconductor die 110 to fill the trench 132. Therefore, the thermal conductive layer 160 and the redistribution circuit structure 140 are disposed on opposite sides of the semiconductor die 110. In some embodiments, the thermal conductive layer 160 extends outwardly from the rear surface 114b of the semiconductor die 110 to cover portions of the second surface 130b of the encapsulant 130 and the top surface of the thermal conductive pattern 108. In some embodiments, the thermal conductive layer 160 covers the second surface 130b of the encapsulant 130 aside the top surface of the thermal conductive pattern 108. In some embodiments, the thermal conductive layer 160 is separated from the top surfaces of the through vias 106a, 106b to electrically insulate from the through vias 106a, 106b. In other words, edges of the thermal conductive layer 160 is separated from edges of the through vias 106a, and thus the thermal conductive layer 160 is electrically insulated from the through vias 106a.

In some embodiments, the thermal conductive layer 160 may be in contact with the rear surface 114b of the semiconductor die 110, the portions of the second surface 130b of the encapsulant 130 and the top surface of the thermal conductive pattern 108. In some embodiments, the thermal conductive layer 160 covers the top surface of the thermal conductive pattern 108 entirely, for example. However, in some alternative embodiments, the thermal conductive layer 160 may cover the thermal conductive pattern 108 partially or may not cover the thermal conductive pattern 108.

In some embodiments, the thermal conductive layer 160 includes a first portion 162 covering the semiconductor die 110 and a second portion 164 covering the encapsulant 130 and the thermal conductive pattern 108. In some embodiments, a top surface of the first portion 162 is substantially flush with a top surface of the second portion 164, for example. However, in some alternative embodiments, the top surfaces of the first portion 162 and the second portion 164 may not be coplanar with each other. In some embodiments, the first portion 162 is thicker than the second portion 164 since a portion of the first portion 162 is filled in the trench 132. In other words, a thickness T1 of the first portion 162 from the rear surface 114b of the semiconductor die 110 to its own top surface is larger than a thickness T2 of the second portion 164 from the second surface 130b of the encapsulant 130 to its own top surface. In some embodiments, the thickness T2 may be larger than or equal to 5 µm, for example. In some embodiments, an interface between the semiconductor die 110 and the thermal conductive layer 160 is lower than an interface between the encapsulant 130 and the thermal conductive layer 160. The thermal conductive layer 160 is a conductive paste such as a silver paste, and is formed by a printing process, for example.

Figure 2G:
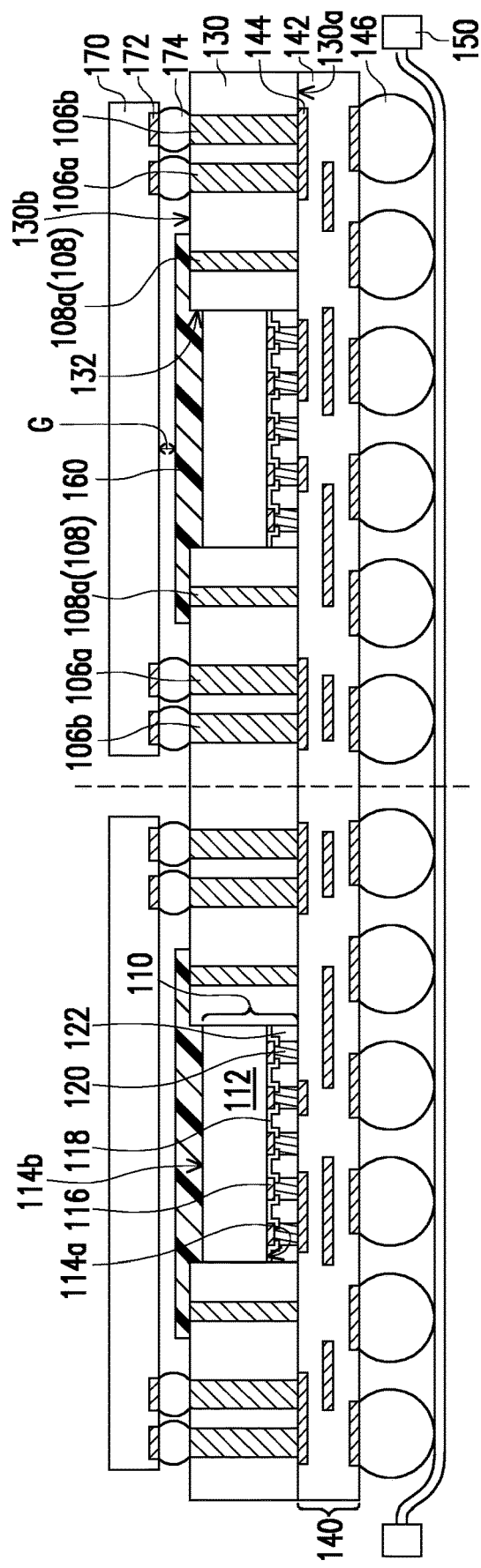

Referring to FIG. 1 and FIG. 2G, in Step S80, a semiconductor device 170 is stacked over and electrically connected to the semiconductor die 110. In some embodiments, the semiconductor device 170 is a package such as a dynamic random access memory (DRAM) package or any other suitable semiconductor device. In some embodiments, the semiconductor device 170 is disposed on the thermal conductive layer 160 over the semiconductor die 110, and the thermal conductive layer 160 is disposed between the semiconductor die 110 and the semiconductor device 170. In some embodiments, the semiconductor device 170 includes a plurality of contacts 172. The contacts 172 may be pads or metal posts on the pads, for example. The contacts 172 of the semiconductor device 170 are electrically connected to the redistribution circuit structure 140 through conductive elements 174 and the through vias 106a, 106b. In some embodiments, the conductive elements 174 are, for example, solder balls or BGA balls placed on the semiconductor device 170. In some embodiments, a gap G is formed between the semiconductor device 170 and the thermal conductive layer 160, that is, the gap G is less than a height of the conductive element 174. Accordingly, the thermal conductive layer 160 is not in contact with and thus electrically insulated from the semiconductor device 170. In some embodiments, the gap G may range from 25% to 40% of the height of the conductive element 174, for example. In some embodiments, a vertical distance between the semiconductor die 110 and the semiconductor device 170 may range from 50 to 60 µm, and the gap G may be larger than 10 µm, for example. In some alternative embodiments, at least a portion of the thermal conductive layer 160 is in direct contact with the second die 170. In other words, portions of the thermal conductive layer 160 may be in contact with the second die 170, portions of the thermal conductive layer 160 may be separated from the second die 170 by a distance, and a top surface of the thermal conductive layer 160 may be not flat, for example.

Figure 2H:
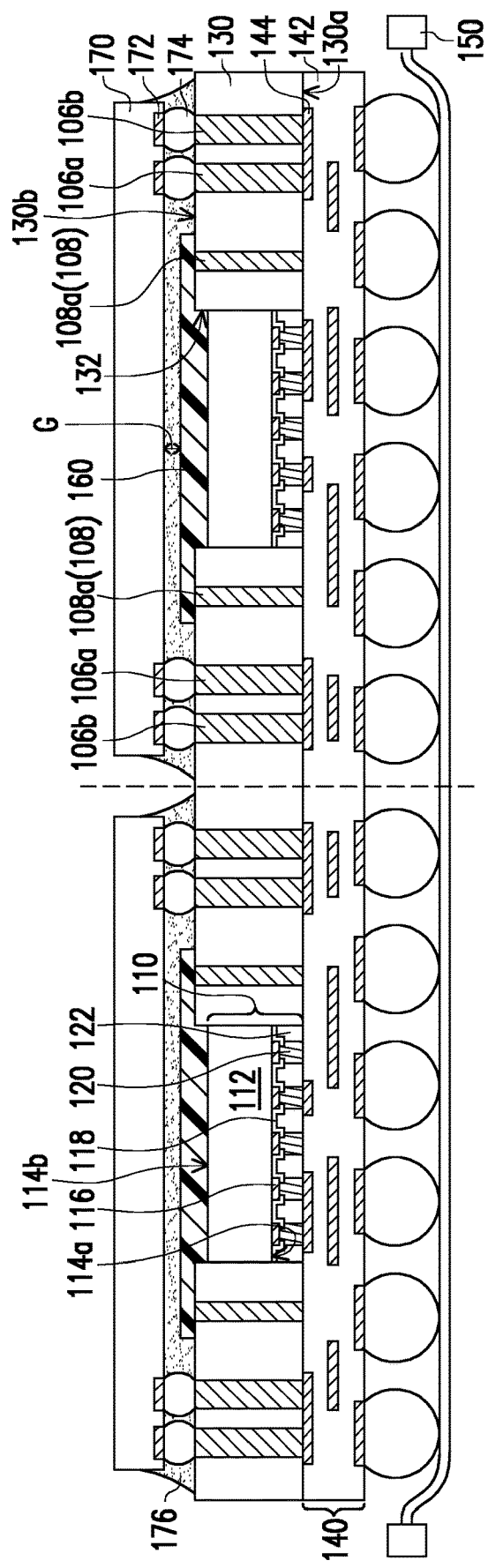

Referring to FIG. 2H, in some embodiments, an underfill 176 is formed among the conductive elements 174, the semiconductor device 170 and the thermal conductive layer 160. Therefore, the gap G is filled with the underfill 176. In some embodiments, the underfill 176 in the gap G between the semiconductor device 170 and the thermal conductive layer 160 ensures the electrical insulation between the semiconductor device 170 and the thermal conductive layer 160.

Figure 2I:
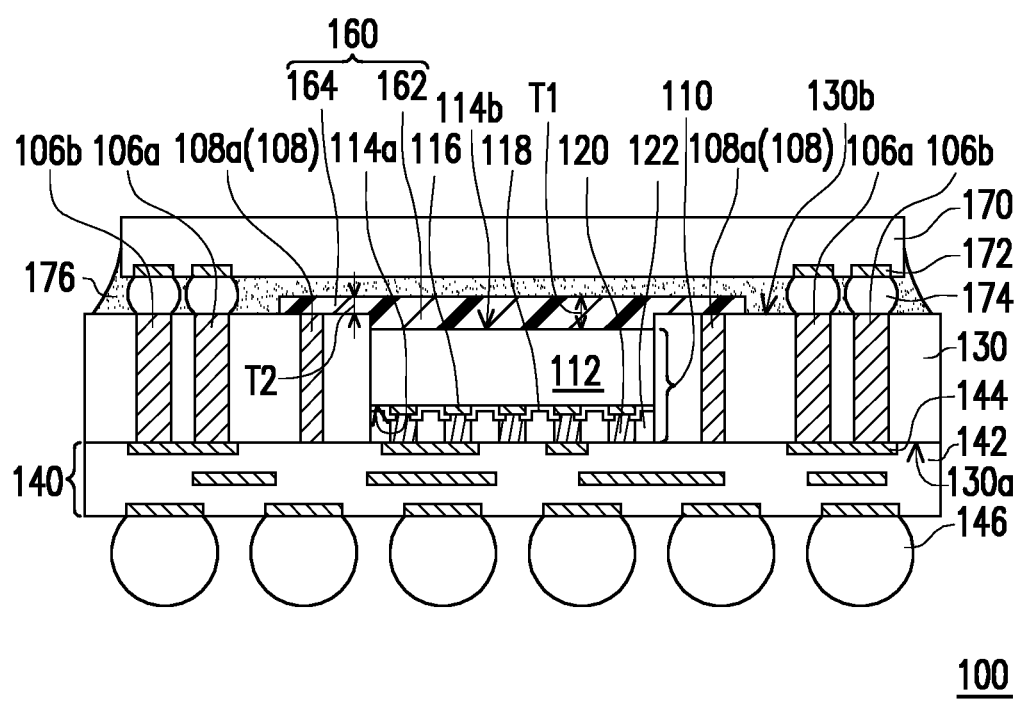

Referring to FIGS. 1, 2H and 2I, in some embodiments, a dicing process is performed to cut the whole package structure (at least cutting though the encapsulant 130 and the redistribution circuit structure 140) along the cutting line (the dotted line) into individual and separated semiconductor packages 100, as shown in FIG. 2I. In one embodiment, the dicing process is a wafer dicing process including mechanical blade sawing or laser cutting. In some embodiments, the semiconductor package 100 is a integrated fan-out Package-on-Package (InFO PoP) device, for example. In some alternative embodiments, the semiconductor package 100 may be further mounted on an electronic device, the electronic device may be a board such as a printed circuit board (PCB), for example. In some alternative embodiments, the semiconductor package 100 may be mounted with additional packages, chips/dies or other electronic devices.

In some embodiments, as shown in FIG. 2I, the through vias 106a, 106b and the thermal conductive pattern 108 are embedded in the encapsulant 130 aside the semiconductor die 110, and the thermal conductive layer 160 is disposed on the semiconductor die 110 and extends onto the encapsulant 130. The through vias 106a, 106b are electrically connected to the semiconductor die 110, and the thermal conductive pattern 108 is electrically insulated from the semiconductor die 110 but thermally coupled to the semiconductor die 110 through thermal conductive layer 160. Accordingly, the heat generated by any component of the semiconductor package 100 such as the semiconductor die 110 or the semiconductor device 170 may be dissipated through the thermal conductive layer 160 and the thermal conductive pattern 108, and the thermal dissipation area for the semiconductor package 100 is expanded. Thus, for example, compared to the conventional semiconductor package without the thermal conductive pattern and the thermal conductive layer, the conventional semiconductor package with the thermal conductive layer (which is not in contact with the semiconductor device) and without the thermal conductive pattern, or the conventional semiconductor package with the thermal conductive layer (which is in contact with the semiconductor device) and without the thermal conductive pattern, the thermal dissipation efficiency of the semiconductor die may be improved.

Figure 4:
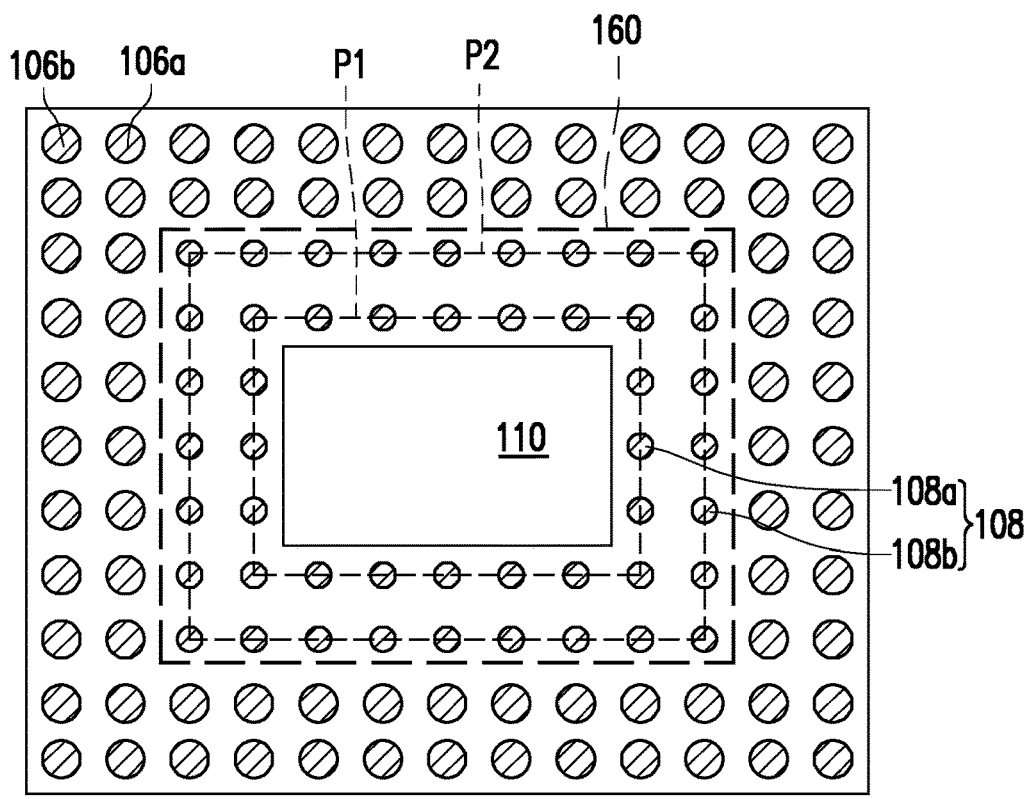
FIG. 4 is a simplified top view of a semiconductor package in accordance with some embodiments.
Figure 5:
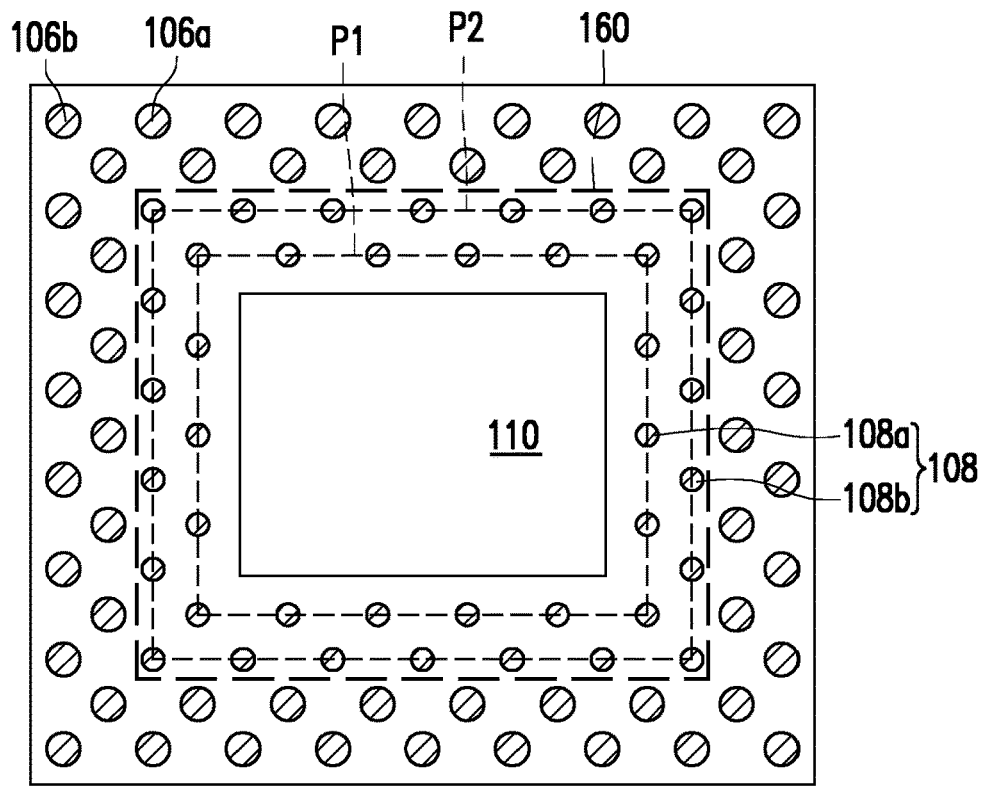
FIG. 5 is a simplified top view of a semiconductor package in accordance with some embodiments.

In some embodiments, the thermal conductive pattern 108 is illustrated as having a plurality of discrete through vias 108a arranged along one ring-shaped path P1, however, the disclosure is not limited thereto. In other words, the thermal conductive pattern may be arranged along a plurality of ring-shaped paths. In some embodiments, as shown in FIG. 4, the thermal conductive pattern 108 may include a plurality of through vias 108a, 108b arranged along a plurality of ring-shaped paths P1, P2. In some embodiments, a first group of discrete through vias 108a is arranged along the first ring-shaped path P1, a second group of discrete through vias 108b is arranged along the second ring-shaped path P2 surrounding the first ring-shaped path P1, and the ring-shaped paths P1, P2 respectively surround the semiconductor die 110. In some embodiments, the second group of the through via 108b is disposed between the first group of the through via 108a and the first group of the through vias 106a. In some embodiments, a width of the through via 108a may be the same as or different from a width of the through via 108b. In some embodiments, in the direction perpendicular to the stacking direction of the semiconductor die 110 and the semiconductor device 170, one of the through vias 108a of the first group is partially aligned with one of the through vias 108b of the second group, for example. In addition, the aligned through via 108a, 108b may be further aligned with the aligned through via 106a and the through via 106b. However, in some alternative embodiments, the through vias 106a, 106b may be not aligned with each other or may be not aligned with the through vias 108a, 108b. For example, in some embodiments, as shown in FIG. 5, in the direction perpendicular to the stacking direction, one of the through vias 108a of the first group and one of the through vias 108b of the second group are immediately adjacent to each other, and they may be disposed alternately. In addition, in some embodiments, the through via 106a and the through via 106b immediately adjacent to each other may be also disposed alternately. In some embodiments, in the direction perpendicular to the stacking direction, one of the through vias 108a of the first group may be partially aligned with one of the through vias 106a of the first group, and similarly, one of the through vias 108b of the second group is partially aligned with one of the through vias 106b of the second group, for example.

Figure 6:
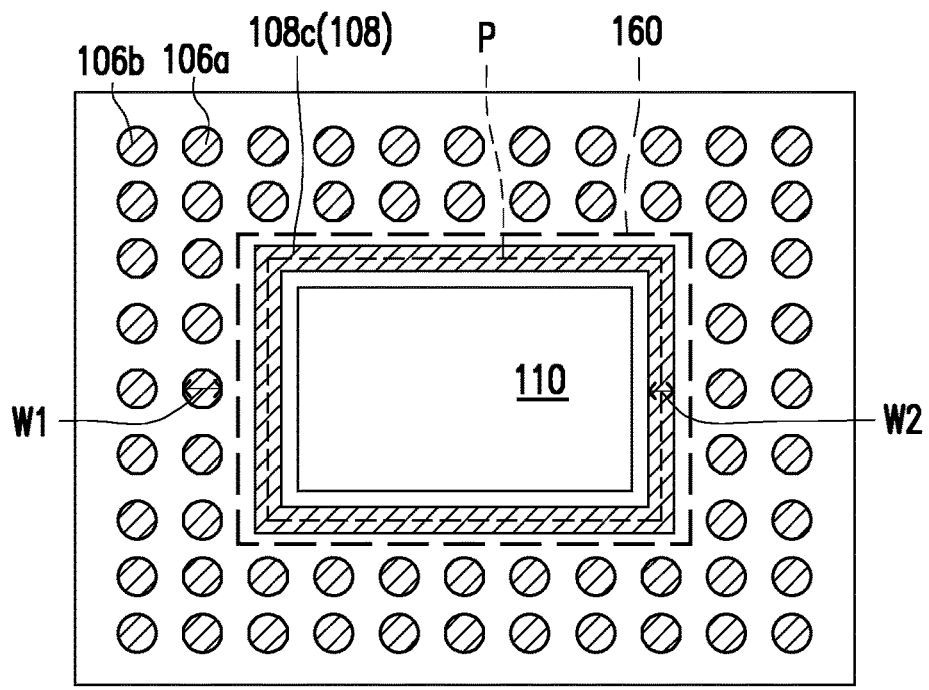
FIG. 6 is a simplified top view of a semiconductor package in accordance with some embodiments.

The thermal conductive pattern 108 may have other configurations. For example, as shown in FIG. 6, the thermal conductive pattern 108 includes a ring-shaped structure 108c surrounding the semiconductor die 110. The ring-shaped structure 108c is continuously formed along a ring-shaped path P. In other words, the ring-shaped structure 108c is continuously disposed around the semiconductor die 110. In some embodiments, a width W2 of the ring-shaped structure 108c may be substantially the same, and the width W2 may range from one half to two times of a dimension (e.g., width W1) of one of the through via 106a, 106b, for example. In some alternative embodiments, the thermal conductive pattern 108 may include a plurality of ring-shaped structures respectively disposed along a plurality of ring-shaped paths surrounding the semiconductor die 110.

Figure 7:
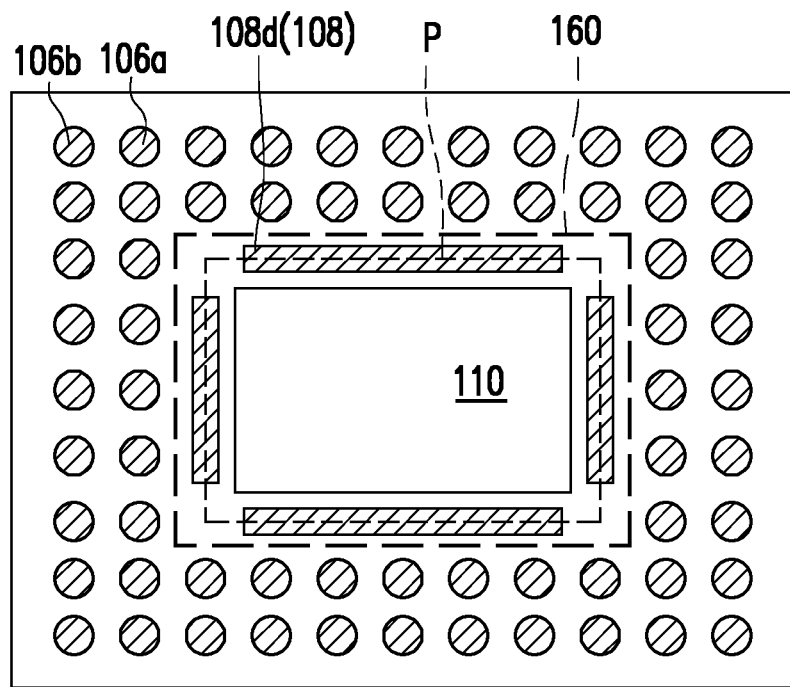
FIG. 7 is a simplified top view of a semiconductor package in accordance with some embodiments.
Figure 8:
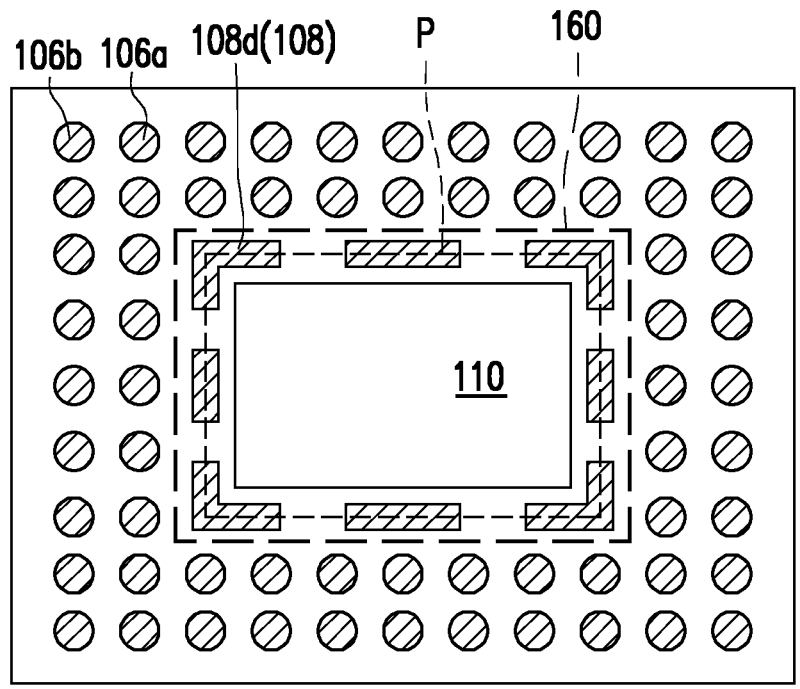
FIG. 8 is a simplified top view of a semiconductor package in accordance with some embodiments.

In some embodiments, as shown in FIG. 7 and FIG. 8, the thermal conductive pattern 108 may include a plurality of discrete wall-shaped structures 108d. The wall-shaped structures 108d are separated from each other, and the wall-shaped structures 108d are arranged along one ring-shaped path P. In some embodiments, as shown in FIG. 7, the wall-shaped structures 108d are respectively disposed at one side of the semiconductor die 110. In some embodiments, the wall-shaped structures 108d is a cuboid, for example. In some embodiments, as shown in FIG. 8, at least one wall-shaped structure 108d may be disposed at two adjacent sides of the semiconductor die 110. In some alternative embodiments, one wall-shaped structure 108d may be disposed at three or four adjacent sides of the semiconductor die 110, for example. In some embodiments, a width W2 of the wall-shaped structures 108d may be substantially the same, and the width W2 may range from one half to two times of a dimension (e.g., width W1) of one of the through via 106a, 106b, for example. In some alternative embodiments, the width W2 of the wall-shaped structures 108d may be different. In some alternative embodiments, the wall-shaped structures 108d may be arranged along a plurality of ring-shaped paths respectively surrounding the semiconductor die 110. Additionally, it is noted that in FIGS. 3-8, the distance between the semiconductor die 110 and the thermal conductive pattern 108 or between the thermal conductive pattern 108 and the through via 106a are exemplified for illustration, actually, in some embodiments, the above distance may be larger than the distance between the adjacent two through vias 106a, 106b, for example. However, in some alternative embodiments, the above distance may be equal to or smaller than the distance between the adjacent two through vias 106a, 106b. Furthermore, the material of the thermal conductive pattern 108 in FIGS. 3-8 may be conductive material such as those described for the through vias 108a.

In above embodiments, the thermal conductive pattern is illustrated as arranged along one ring-shaped path or two ring-shaped paths, however, the disclosure is not limited thereto. In other words, the thermal conductive pattern may be arranged along more than two ring-shaped paths. In addition, the ring-shaped paths may have the same or different shape, and the spacing between the components of the thermal conductive pattern along the adjacent two ring-shaped paths may be the same or different.

Figure 9:
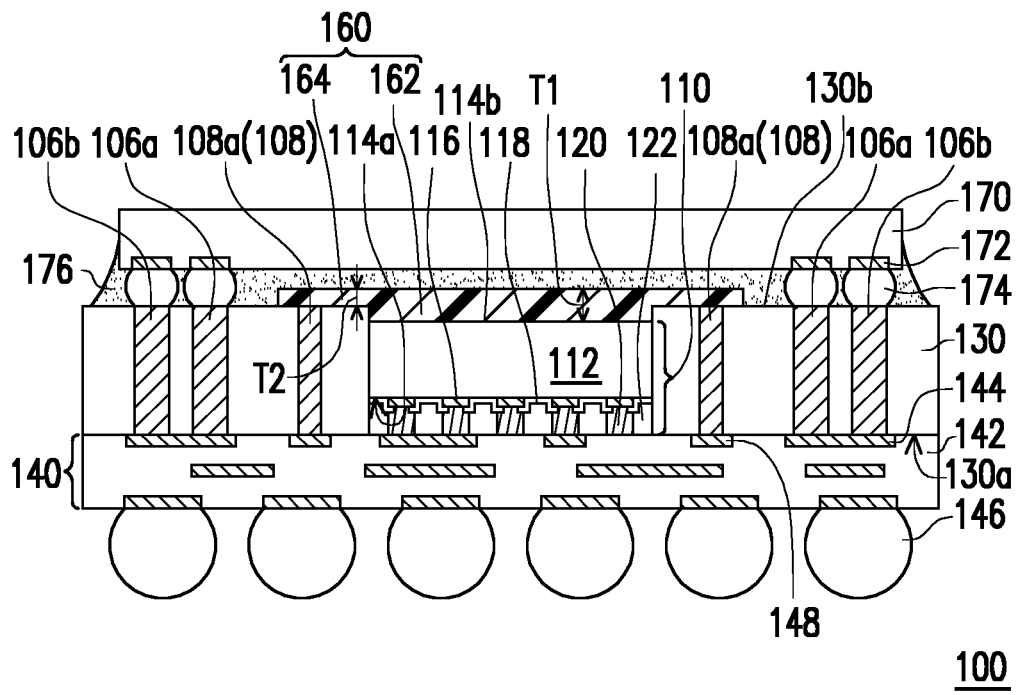
FIG. 9 is a schematic cross sectional view illustrating a semiconductor package in accordance with some embodiments.

FIG. 9 is a schematic cross sectional view illustrating a semiconductor package in accordance with some embodiments. The difference between the semiconductor package of FIG. 9 and the semiconductor package of FIG. 2I lies in that the redistribution circuit structure further includes a dummy pattern. The difference is illustrated in details below, and the similarity is not iterated herein. In some embodiments, as shown in FIG. 9, the redistribution circuit structure 140 further includes a dummy pattern 148 electrically insulated from the redistribution patterns 144 in the package structure or an electrical component of the same package structure or another package structure. In some embodiments, the dummy pattern 148 is disposed at the bottom of the redistribution circuit structure 140. In some embodiments, the dummy pattern 148 is disposed on the first surface 130a of the encapsulant 130 and disposed in the dielectric layer 142 of the redistribution circuit structure 140. In some embodiments, the thermal conductive pattern 108 is connected to the dummy pattern 148, which means the thermal conductive pattern 108 is electrically connected to the dummy pattern 148. In some embodiments, the thermal conductive pattern 108 may be in contact with the dummy pattern 148, for example. In some embodiments, the thermal conductive pattern 108 is thermally coupled to the thermal conductive layer 160 at a first side, and thermally coupled to the dummy pattern 148 at a second side opposite to the first side. Accordingly, the heat generated by the semiconductor package may be dissipated through the thermal conductive layer 160, the thermal conductive pattern 108 and the dummy pattern 148, and the thermal dissipation area for the semiconductor die 110 is expanded. Thus, the thermal dissipation efficiency may be improved.

Figure 10:
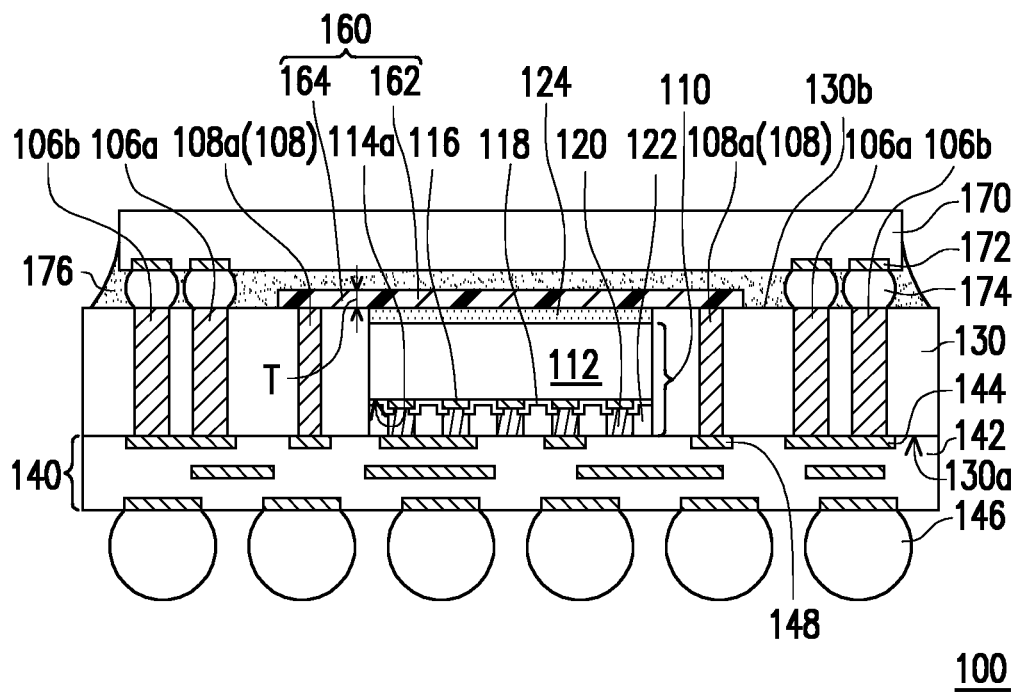
FIG. 10 is a schematic cross sectional view illustrating a semiconductor package in accordance with some embodiments.

FIG. 10 is a schematic cross sectional view illustrating a semiconductor package in accordance with some embodiments. The difference between the semiconductor package of FIG. 10 and the semiconductor package of FIG. 2I lies in that the semiconductor package further includes a die attach film. The difference is illustrated in details below, and the similarity is not iterated herein. In some embodiments, as shown in FIG. 10, if a die attach film 124 has good thermal conductivity, the die attach film 124 may be not removed before forming a thermal conductive layer 160, and thus the die attach film 124 may be disposed between the semiconductor die 110 and the thermal conductive layer 160, for example. In some embodiments, the thermal conductive layer 160 may substantially have a constant thickness T, that is, a first portion 162 over the semiconductor die 110 and a second portion 164 over the encapsulant 130 and the thermal conductive pattern 108 may substantially have the same thickness T. The thickness T may be larger than or equal to 5 μm, for example.

In some embodiments, the semiconductor package has the heat dissipation structure thermally coupled to the semiconductor die. In some embodiments, the heat dissipation structure includes the thermal conductive pattern aside the semiconductor die and the thermal conductive layer disposed on the semiconductor die and extending onto the thermal conductive pattern. Thus, the thermal conductive pattern may be thermally coupled to the semiconductor die through the thermal conductive layer. By disposing the heat dissipation structure, the thermal dissipation area for the semiconductor package may be largely expanded, and the heat dissipation efficiency of the semiconductor package may be significantly improved. In addition, although the thermal conductive layer is disposed between the semiconductor die and the semiconductor device, a height of the thermal conductive layer is controlled to prevent from being in contact with the semiconductor device thereover. Accordingly, cold joint risk such as PoW (Package on Wafer) cold joint risk and other process issue may be prevented. Furthermore, the extension of the thermal conductive layer onto the encapsulant and the thermal conductive pattern increases the contact area between the semiconductor die and the thermal conductive layer, thereby enhancing the adhesion of the thermal conductive layer to the semiconductor die. Therefore, the thermal dissipation of the semiconductor package is stable and improved.

According to some embodiments, a semiconductor package includes a semiconductor die, a thermal conductive pattern, an encapsulant and a thermal conductive layer. The thermal conductive pattern is disposed aside the semiconductor die. The encapsulant encapsulates the semiconductor die and the thermal conductive pattern. The thermal conductive layer covers a rear surface of the semiconductor die, wherein the thermal conductive pattern is thermally coupled to the semiconductor die through the thermal conductive layer and electrically insulated from the semiconductor die.

According to some embodiments, a semiconductor package includes a semiconductor die, an encapsulant, a first through via, a second through via and a thermal conductive layer. The encapsulant laterally encapsulates the semiconductor die. The first through via is embedded in the encapsulant and electrically connected to the semiconductor die. The second through via is embedded in the encapsulant and electrically insulated from the semiconductor die. The thermal conductive layer covers the semiconductor die, wherein the second through via is thermally coupled to the semiconductor die through the thermal conductive layer.

According to some embodiments, a semiconductor package includes a semiconductor die, an encapsulant, a first through via, a second through via and a thermal conductive layer. The encapsulant laterally encapsulates the semiconductor die. The first through via is embedded in the encapsulant and electrically connected to the semiconductor die. The second through via is embedded in the encapsulant and electrically insulated from the semiconductor die. The thermal conductive layer covers the semiconductor die and the encapsulant, wherein the thermal conductive layer comprises a first portion covering the semiconductor die and a second portion covering the second through via, and the first portion of the thermal conductive layer is thicker than a second portion of the thermal conductive layer.

According to some embodiments, a semiconductor package includes a semiconductor die, a first thermal conductive pattern and a second thermal conductive pattern. The semiconductor die is encapsulated by an encapsulant. The first thermal conductive pattern is disposed aside the semiconductor die in the encapsulant. The second thermal conductive pattern is disposed over the semiconductor die, wherein the first thermal conductive pattern is thermally coupled to the semiconductor die through the second thermal conductive pattern and electrically insulated from the semiconductor die.

According to some embodiments, a semiconductor package includes a semiconductor die, a through via, a heat dissipation pattern and a heat dissipation material. The through via is disposed aside and electrically connected to the semiconductor die. The heat dissipation pattern is disposed between and electrically insulated from the semiconductor die and the through via. The heat dissipation material is disposed over the semiconductor die, wherein the heat dissipation pattern is thermally coupled to the semiconductor die through the heat dissipation material.

According to some embodiments, a semiconductor package includes a semiconductor die, a semiconductor device, a plurality of through vias, a thermal conductive pattern and a thermal conductive material. The semiconductor die is encapsulated by an encapsulant. The semiconductor device is disposed over the semiconductor die and the encapsulant. The through vias are embedded in the encapsulant and surround the semiconductor die and are electrically connected to the semiconductor device. The thermal conductive pattern is embedded in the encapsulant and electrically insulated from the semiconductor die. The thermal conductive material is disposed between the semiconductor die and the semiconductor device, wherein the thermal conductive pattern is thermally coupled to the semiconductor die through the thermal conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor die, encapsulated by an encapsulant;
   a first thermal conductive pattern aside the semiconductor die in the encapsulant; and
   a second thermal conductive pattern over the semiconductor die, wherein the first thermal conductive pattern is thermally coupled to the semiconductor die through the second thermal conductive pattern and electrically insulated from the semiconductor die, and a material of the first thermal conductive pattern is different from a material of the second thermal conductive pattern.

2. The semiconductor package as claimed in claim 1, wherein a portion of the second thermal conductive pattern is extended over the encapsulant.

3. The semiconductor package as claimed in claim 1, wherein the first thermal conductive pattern comprises a plurality of through vias penetrating through the encapsulant.

4. The semiconductor package as claimed in claim 1, wherein the second thermal conductive pattern is in direct contact with the first thermal conductive pattern and the semiconductor die.

5. The semiconductor package as claimed in claim 1, wherein a top surface of the encapsulant is disposed between a top surface of the semiconductor die and a top surface of the second thermal conductive pattern.

6. The semiconductor package as claimed in claim 1 further comprising an adhesive material between the semiconductor die and the second thermal conductive pattern.

7. The semiconductor package as claimed in claim 1 further comprising a dummy pattern and a redistribution pattern below the semiconductor die, wherein the first thermal conductive pattern is in direct contact with the dummy pattern and insulated from the redistribution pattern.

8. A semiconductor package, comprising:
a semiconductor die;
a through via, disposed aside and electrically connected to the semiconductor die;
a heat dissipation pattern, disposed between and electrically insulated from the semiconductor die and the through via; and
a heat dissipation material over the semiconductor die, wherein the heat dissipation pattern is thermally coupled to the semiconductor die through the heat dissipation material.

9. The semiconductor package as claimed in claim 8 further comprising an encapsulant encapsulating the semiconductor die, the heat dissipation pattern and the through via.

10. The semiconductor package as claimed in claim 8, wherein the heat dissipation material is in direct contact with the heat dissipation pattern.

11. The semiconductor package as claimed in claim 8, wherein the heat dissipation material comprises a first portion covering the semiconductor die and a second portion covering the heat dissipation pattern, and the first portion is thicker than the second portion.

12. The semiconductor package as claimed in claim 8, wherein the heat dissipation pattern is a thermal conductive through via, and the heat dissipation material is a conductive paste.

13. A semiconductor package, comprising:
a semiconductor die, encapsulated by an encapsulant;
a semiconductor device over the semiconductor die and the encapsulant;
a plurality of through vias embedded in the encapsulant, surrounding the semiconductor die and electrically connected to the semiconductor device;
a thermal conductive pattern embedded in the encapsulant and electrically insulated from the semiconductor die; and
a thermal conductive material between the semiconductor die and the semiconductor device, wherein the thermal conductive pattern is thermally coupled to the semiconductor die through the thermal conductive material.

14. The semiconductor package as claimed in claim 13, wherein the thermal conductive pattern is disposed between the semiconductor die and the plurality of through vias.

15. The semiconductor package as claimed in claim 13, wherein the thermal conductive pattern comprises a plurality of discrete thermal conductive through vias surrounding the semiconductor die.

16. The semiconductor package as claimed in claim 13, wherein the thermal conductive pattern comprises a ring-shaped structure surrounding the semiconductor die.

17. The semiconductor package as claimed in claim 13, wherein the thermal conductive pattern comprises a plurality of discrete wall-shaped structures.

18. The semiconductor package as claimed in claim 13 further comprising an underfill between the thermal conductive material and the semiconductor device.

19. The semiconductor package as claimed in claim 13, wherein a material of the thermal conductive pattern is the same as a material of the plurality of through vias.

20. The semiconductor package as claimed in claim 13, wherein the thermal conductive material is a conductive paste.

* * * * *